United States Patent [19]
Manning

[11] Patent Number: 6,043,558
[45] Date of Patent: Mar. 28, 2000

[54] IC PACKAGES INCLUDING SEPARATED SIGNAL AND POWER SUPPLY EDGE CONNECTIONS, SYSTEMS AND DEVICES INCLUDING SUCH PACKAGES, AND METHODS OF CONNECTING SUCH PACKAGES

[75] Inventor: Troy Manning, Meridian, Id.

[73] Assignee: Micron Technology, Inc., Boise, Id.

[21] Appl. No.: 08/928,875

[22] Filed: Sep. 12, 1997

[51] Int. Cl.[7] .............................. H05K 7/20; H01L 23/50; H01L 23/28; H01L 23/48

[52] U.S. Cl. .................. 257/691; 257/207; 257/208; 257/679; 257/666; 257/778; 257/693

[58] Field of Search ..................... 257/691, 666, 257/676, 696, 698, 778, 723, 207, 208, 679, 693, 692

[56] References Cited

U.S. PATENT DOCUMENTS

| | | | |
|---|---|---|---|
| 4,734,909 | 3/1988 | Bennett et al. | 370/462 |
| 4,934,820 | 6/1990 | Takahashi et al. | 257/696 |
| 5,229,916 | 7/1993 | Frankeny et al. | 361/718 |
| 5,252,853 | 10/1993 | Michii | 257/691 |
| 5,260,601 | 11/1993 | Baudouin et al. | 257/696 |
| 5,349,235 | 9/1994 | Lee et al. | 257/723 |
| 5,394,008 | 2/1995 | Ito et al. | 257/696 |
| 5,406,028 | 4/1995 | Beng et al. | 257/692 |
| 5,428,247 | 6/1995 | Sohn et al. | 257/691 |
| 5,444,304 | 8/1995 | Hara et al. | 257/722 |
| 5,451,815 | 9/1995 | Taniguchi et al. | 257/700 |
| 5,466,888 | 11/1995 | Beng et al. | 257/696 |
| 5,468,991 | 11/1995 | Lee et al. | 257/666 |
| 5,473,188 | 12/1995 | Ando | 257/696 |
| 5,497,027 | 3/1996 | Crafts | 257/528 |
| 5,534,729 | 7/1996 | Russell | 257/691 |
| 5,535,342 | 7/1996 | Taylor | 710/127 |
| 5,574,310 | 11/1996 | Sono et al. | 257/696 |
| 5,632,029 | 5/1997 | Bruce et al. | 710/126 |
| 5,633,785 | 5/1997 | Parker et al. | 361/766 |
| 5,635,760 | 6/1997 | Ishikawa | 257/696 |
| 5,700,975 | 12/1997 | Takata et al. | 257/690 |
| 5,861,666 | 1/1999 | Bellaar | 257/686 |
| 5,877,975 | 3/1999 | Jigour et al. | 365/52 |

*Primary Examiner*—Alexander Oscar Williams
*Attorney, Agent, or Firm*—Trask, Britt & Rossa

[57] ABSTRACT

A packaging technique for high speed components, such as high speed DRAMS, may involve a package which includes two opposed edges, one edge adapted to receive a power supply and ground contacts which may be ganged together to form a ganged power supply lead and a ganged ground lead. A second edge is arranged to receive normal signal contacts. In this way, the lead inductance may be minimized and the operation efficiency of the package may be improved.

20 Claims, 2 Drawing Sheets

IC PACKAGES INCLUDING SEPARATED SIGNAL AND POWER SUPPLY EDGE CONNECTIONS, SYSTEMS AND DEVICES INCLUDING SUCH PACKAGES, AND METHODS OF CONNECTING SUCH PACKAGES

BACKGROUND OF THE INVENTION

This invention relates generally to packaging techniques for microelectronic components and at least in certain specific applications to packaging techniques for packaging high speed dynamic random access memories ("DRAMs").

In packaging high speed devices, it is important that the leads which connect the integrated circuit chip or die to the exterior be as short as possible in order to reduce impedance, which tends to slow down the device. One approach to achieving this goal has been to place all of the high speed pins along one side of the package and to connect them to the die using short leads.

One common packaging technique is the "lead on chip" or LOC process in which a leadframe is secured between the pins and the die. Since the leadframe is a unitary device, it may readily be secured in an automated process. In conventional designs, power and ground are brought in through a pair of leadframe leads which may have a generally U-shaped configuration. Signal leads may be located inside the U-shaped configuration of the power and ground leads and all of the different leads are connected as necessary to the integrated chip or die.

As progressively higher speed devices are developed, it is important that these devices be packaged in a way that achieves the highest possible speed. Thus, there is a continued demand for packages which facilitate high speed operation from a variety of electronic components including DRAMs.

SUMMARY OF THE INVENTION

In accordance with one aspect of the present invention, an integrated circuit package includes a surface having at least two edges. A plurality of contacts is located along the first edge of the surface. A power supply contact is located on a different edge of the surface.

In accordance with another aspect of the present invention, a vertical surface mount package having a pair of opposed edges includes a plurality of connections along one edge of the package. A power supply connection is made on the opposite edge of the package.

In accordance with still another aspect of the present invention, a method for contacting an integrated circuit die includes the step of contacting the die in a plurality of locations on a first edge of the package. A contact is provided along a different edge of the package for the power supply.

In accordance with still another aspect of the present invention, a computer system includes a processor and memory. The memory may include a dynamic random access memory contained in a package having two opposed edges. A first of the edges includes the contacts for receiving signals and the other of the edges includes contacts for receiving ground and power supply connections. The power supply connections are ganged together.

In accordance with yet another aspect of the present invention, an electronic device includes a first board and a plurality of vertical mount packages. The packages each have a first end electrically connected to the board. The packages also include second ends. A second board is connected to the second ends of the packages. A plurality of signal contacts is arranged on the first edge of the packages and a power supply contact is located on another edge of each of the packages.

DESCRIPTION OF THE PREFERRED EMBODIMENTS

Figure 1:
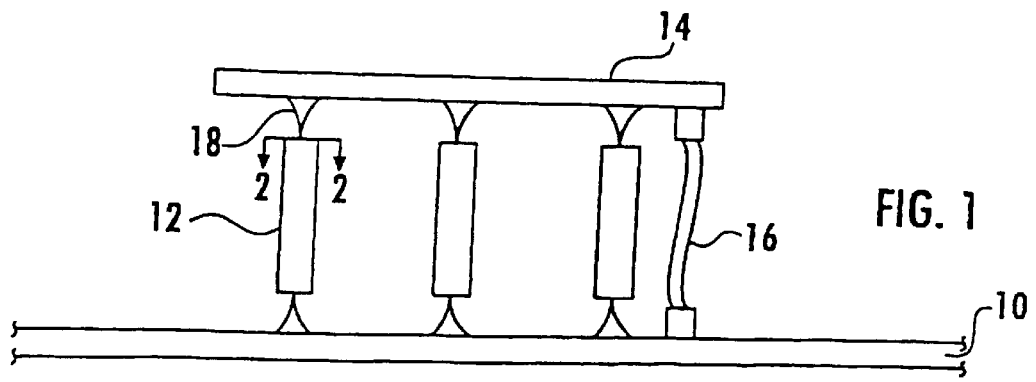
FIG. 1 is a front elevational view of one embodiment of the present invention.

Referring to the drawings wherein like reference characters are used for like parts throughout the several views, a printed circuit board ("PCB") or card 10 connects to a plurality of vertical surface mount packages ("VSMP") 12, which in turn connects to a daughter board 14. The daughter board 14 may connect by a ribbon cable 16 directly to the board 10. In a conventional computer system, the board 10 could be, for example, a motherboard and the VSMPs 12 could be high speed packaged DRAM Single In-Line Memory Modules ("SIMMs") or Dual In-Line Memory Modules ("DIMMs"). The VSMPs 12 may connect by L or J pins 18 to both the daughter board 14 and the board 10.

Figure 2:
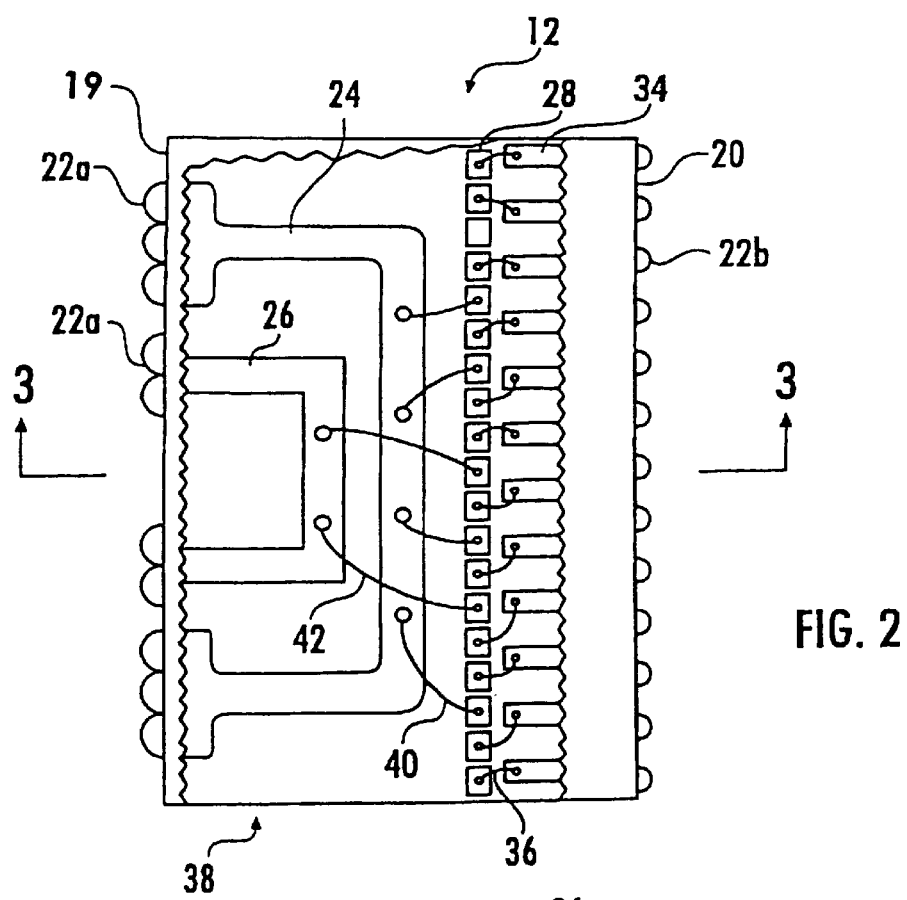
FIG. 2 is an enlarged partial cross-sectional view taken generally along the line 2—2 in FIG. 1.

Referring now to FIG. 2, each of the VSMPs 12 includes a first edge 18 which receives power and ground connections 22a and a second edge 20 which receives signal connections 22b. As illustrated in FIG. 2, a plurality of pins 22a may be ganged together and connected to a U-shaped power lead 24. Similarly, a plurality of pins 22a may be connected together to connect with the ganged ground lead 26.

A row of bonding pads 28 may be positioned adjacent the second edge 20 of the VSMP 12. The connections 22b may make contact with a lead on chip (LOC) assembly which includes a plurality of leads 34. The leads 34 are connected to certain of the bonding pads 28 by wires 36. In addition, the ganged power supply lead 24 is connected by the wires 40 to certain other of the bonding pads 28 in the row of bonding pads 28. Similarly, connections 42 are made to certain bonding pads 28 from the ganged ground supply 26.

Figure 3:
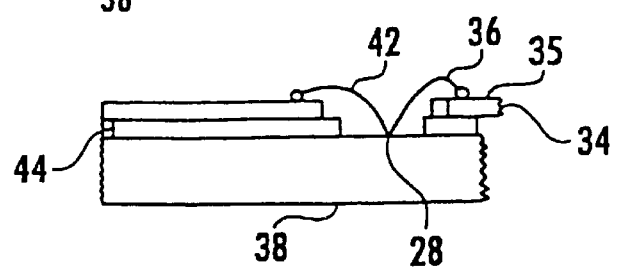
FIG. 3 is a partially sectioned view taken generally along the line 3—3 in FIG. 2.

Referring now to FIG. 3, the integrated circuit chip 38 may have one or more tapes 44 arranged to secure the lead frame 35 to the integrated circuit chip 38. The power lead 24 may then be wire bonded into the row of bonding pads 28 by a wire 40. Similarly, the leads 34 may be connected by wires 36 to one or more bonding pads 28 and the ground lead 26 may be wire bonded using wire 42 to the bonding pads 28.

With this arrangement, the use of relatively thin leads for power and ground may be avoided because a number of pins 22a may be ganged together to form a wide power lead 24 and a wide ground lead 26. This reduces the inductance involved with the packaging. At the same time, high speed pins 22b may be maintained close to the board 10 using a conventional assembly process.

The connection 16, in the form of a ribbon cable or other conductor, connects the ground and power supplies to the daughter board 14.

Figure 4:
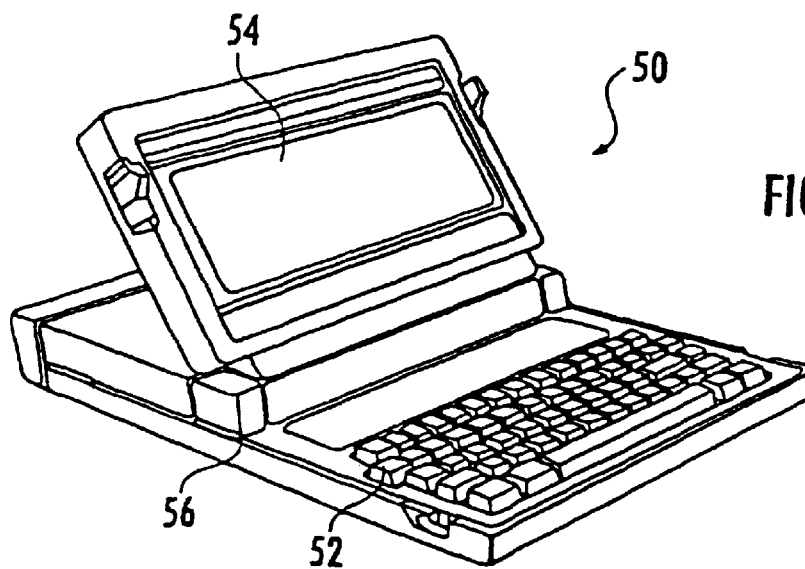
FIG. 4 is a perspective view of a portable computer.

In accordance with one exemplary application of the VSMP packages 12, packages 12 may implement DRAM memory for a personal computer 50, shown in FIG. 4. The personal computer 50 includes a keyboard 52, a display screen 54, and a housing 56. The illustrated computer 50 is a laptop or notebook style computer. The space saving arrangement of the VSMPs 12 facilitates utilization in this particular application, among many other applications.

Figure 5:
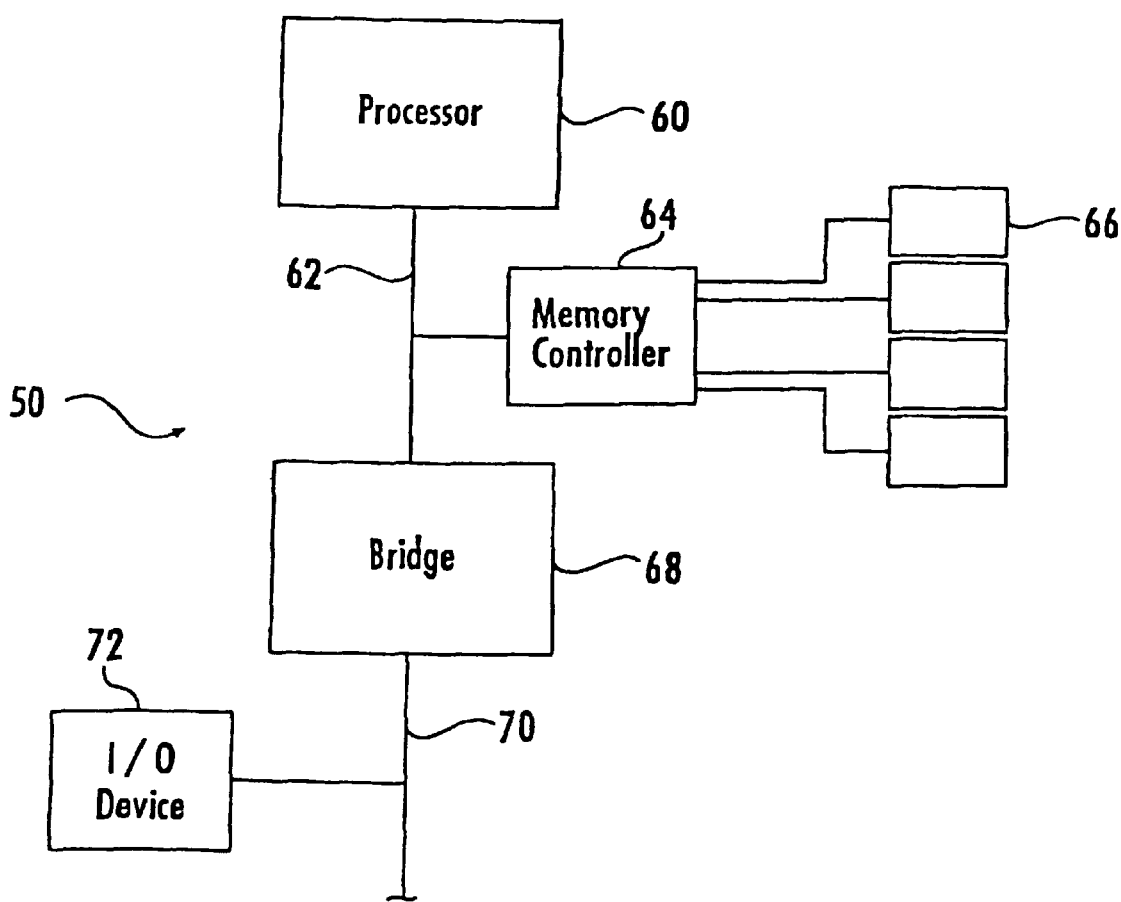
FIG. 5 is a block schematic diagram of the portable computer shown in FIG. 4.

Referring to FIG. 5, the personal computer 50 includes a microprocessor 60, which may be connected to a system bus 62. The system bus 62 connects to a memory controller 64, which in turn connects to a plurality of memory modules 66. The memory modules 66 may be implemented by the VSMPs 12 in the configurations illustrated in FIGS. 1 to 3. The system bus may connect to a bridge 68, which in turn may connect to a peripheral component interconnect ("PCI") bus 70. A variety of input output devices 72 such as a modem, a keyboard, a display screen, a hard disk drive, a CD ROM drive and the like may be connected to the bus 62.

While the present invention has been described with respect to a limited number of embodiments, those skilled in the art will appreciate numerous modifications and variations and it is intended that the appended claims cover all such modifications and variations that fall within the true spirit and scope of the present invention.

What is claimed is:

1. An integrated circuit package, comprising:
   an integrated circuit chip including a surface having at least two edges;
   a plurality of signal contacts along a first edge of said surface; and
   at least one power supply contact adjacent said surface on a different edge of said surface of said integrated circuit chip.

2. The package of claim 1, wherein leads disposed on said surface of said integrated circuit chip extend to said signal contacts.

3. The package of claim 1, wherein a ground connection is also provided at the same edge as said at least one power supply contact.

4. The package of claim 1, wherein said at least one power supply contact comprises a number of pins located along said different edge of said surface of said integrated circuit chip, at least some of said pins being ganged together and connected to an on-chip power supply lead.

5. The package of claim 1, wherein said package is a vertical surface mount package.

6. The package of claim 4, including signal leads and a power supply lead, wherein said signal contacts on said first edge connect to said signal leads and said at least one power supply contact connects to said power supply lead, said power supply lead being wider than said signal leads.

7. A vertical surface mount integrated circuit package, comprising:
   at least one integrated circuit chip having a pair of opposed edges;
   a plurality of connections along one edge of said at least one integrated circuit chip; and
   at least one power supply connection on the opposite edge of said at least one integrated circuit chip.

8. The package of claim 7, wherein said at least one power supply connection includes a number of contacts, said contacts being ganged together and connected to a power supply lead on said at least one integrated circuit chip.

9. A method of electrically connecting to an integrated circuit die, comprising:
   electrically contacting said die at a plurality of locations along a first edge of said die for signal transmission; and
   electrically contacting said die along a second edge of said die for power transmission.

10. The method of claim 9, wherein electrically contacting said die along said second edge includes providing a plurality of power contacts, ganging at least some of said power contacts together and connecting said ganged power contacts to a power supply lead.

11. A computer system, comprising:
    a processor; and
    system memory operably connectable to said processor, said system memory comprising:
    at least one memory package, said at least one memory package having at least two edges including a first edge having a plurality of power supply contacts and at least one ground contact disposed therealong and a second edge having signal contacts disposed therealong.

12. The computer system of claim 11, including a bus connected to said processor and an input/output device connected to said bus.

13. The computer system of claim 11, including signal leads connected to said signal contacts and a power supply lead connected to at least some of said plurality of power supply contacts, said signal leads being narrower than said power supply lead.

14. The computer system of claim 11, wherein said system memory is in the form of a dynamic random access memory.

15. An electronic device, comprising:
    a first board;
    a plurality of vertical mount packages, said packages each having a first end electrically connected to said first board;
    a second board;
    said packages of said plurality each including a second end, said second board electrically connected to said second ends of said packages; and
    a plurality of signal contacts along each of said first ends of said packages and at least one power supply contact on each of said second ends of said packages.

16. The device of claim 15, wherein said at least one power supply contact comprises a plurality of power supply contacts ganged together and connected to a power supply lead.

17. The device of claim 16, including signal leads within said packages connected to said signal contacts, said signal leads being narrower than said power supply lead.

18. The device of claim 17, including a power supply terminal on said first board and a conductor connecting the power supply terminal on said first board to said second board.

19. The device of claim 11, wherein at least some of said plurality of power supply contacts are ganged together.

20. The device of claim 17, including a ground terminal on said first board and a conductor connecting the ground terminal on said first board to said second board.

* * * * *

UNITED STATES PATENT AND TRADEMARK OFFICE
CERTIFICATE OF CORRECTION

PATENT NO.      : 6,043,558
DATED           : March 28, 2000
INVENTOR(S)     : Troy Manning It is certified that error appears in the above-identified patent and that said Letters Patent is hereby corrected as shown below:

Column 3,
Line 57, after "on" change "the" to -- an --

Signed and Sealed this

Seventeenth Day of February, 2004

JON W. DUDAS
*Acting Director of the United States Patent and Trademark Office*